United States Patent [19]

Murphy

[11] Patent Number: 5,000,697

[45] Date of Patent: Mar. 19, 1991

[54] CARRIER SYSTEM FOR PGA ELECTRICAL COMPONENTS

[75] Inventor: Robert H. Murphy, Merrimack, N.H.

[73] Assignee: R.H. Murphy Co., Inc., Amherst, N.H.

[21] Appl. No.: 499,926

[22] Filed: Mar. 27, 1990

[51] Int. Cl.⁵ ............................................ B65D 73/02
[52] U.S. Cl. ...................................... 439/331; 29/762; 206/329; 206/331
[58] Field of Search ............... 439/70, 73, 331, 525, 439/526; 206/328, 329, 331, 332, 334; 29/762, 764

[56] References Cited

U.S. PATENT DOCUMENTS

| | | | |
|---|---|---|---|
| 4,379,505 | 4/1983 | Alemanni | 206/329 |
| 4,549,651 | 10/1985 | Alemanni | 206/329 |
| 4,620,632 | 11/1986 | Alemanni | 206/329 |
| 4,681,221 | 7/1987 | Chickanosky et al. | 206/328 |
| 4,706,161 | 11/1987 | Buckingham | 206/331 |
| 4,765,471 | 8/1988 | Murphy | 206/329 |
| 4,936,783 | 6/1990 | Petersen | 439/331 |

Primary Examiner—Neil Abrams
Attorney, Agent, or Firm—Pearson & Pearson

[57] ABSTRACT

A carrier system for PGA components comprising a carrier frame and a removable retaining means for capturing a PGA component against an insulating plate in the carrier frame. Bumpers at opposite ends of the carrier dissipate mechanical shocks to protect the component. A removable alignment means coacts with the carrier frame to facilitate the positioning of a PGA component on the insulating plate. A removal means facilitates the disengagement of the removable retaining means from the carrier frame when it is appropriate to remove the PGA component.

18 Claims, 4 Drawing Sheets

Fig. 8 ns. For example, PGA components have a large
CARRIER SYSTEM FOR PGA ELECTRICAL COMPONENTS

BACKGROUND OF THE INVENTION

1. Field of the Invention

This invention generally relates to component carriers and more specifically to a system for facilitating the handling of pin grid array components during the production of electrical devices 2. Description of Related Art Semiconductor devices have matured from simple circuit elements into complex components provided in a variety of integrated circuit packages, such as pin grid array (PGA) packages. This maturation has been accompanied by an increase in the complexity of handling these components during assembly and testing operations. For example, PGA components have a large number of terminals and can be quite expensive. Typically a number of PGA and other components occupy positions on a single circuit board.

PGA and similar components are more susceptible to damage from a number of external influences, such as mechanical shock and discharges of accumulated electrostatic charge, than were prior components. The consequence of potential damage and other factors has led to changes in transportation, assembly and testing procedures that utilize such components. Indeed, procedures for handling the components now contribute significantly to the success of electronic assembly production. For example, when electronic components comprised simple transistors, resistors and capacitors, all the components would be assembled on a board without prior testing. If a component failed, debugging procedures were used to isolate defective components; then they were replaced.

It no longer is economically feasible to replace PGA and other integrated circuits and similar components if they are mounted on a board. It is easier to discard the entire board with a number of valuable working components than it is to replace a single failed integrated circuit. Thus, present procedures involve component testing prior to assembly to minimize the risk of mounting a defective component. Although this adds costs to the assembly process, overall the added costs are less than those encountered when a board is assembled with a defective component and discarded.

The need to protect and test integrated circuits during assembly operations led to the development of chip carriers. Chip carriers are special enclosures or packages that house and protect an integrated circuit or the like during processing, production, testing and assembly operations. More specifically, a chip carrier orients an integrated circuit during the production process, assures proper placement and alignment of terminals for testing and for insertion into a printed circuit board. It eliminates stresses from the terminals and seals found in such an integrated circuit. Chip carriers have been so successful, that they now must protect a component from mechanical and electrical damage and provide access to all the terminals to facilitate component testing if the chip carrier is to be acceptable.

As the number of integrated circuit designs and packages have proliferated, so have the number of chip carrier configurations Indeed there are different chip carrier structures for different integrated circuit packages, including chip carriers exclusively for PGA circuits. The following United States Letters Patent disclose different chip carrier structures specifically adapted for use with such PGA circuits:

U.S. Pat. No. 4,549,651 (1985) Alemanni
U.S. Pat. No. 4,620,632 (1986) Alemanni
U.S. Pat. No. 4,765,471 (1988) Murphy The Alemanni patents disclose one- and two-part chip carriers for PGA integrated circuits or components. The one-part chip carrier includes a thin flat base within an outer frame. Retention fingers overlap and engage the bottom face of a PGA component package to capture the package in the carrier. In the two-part chip carriers, a separate plate structure with retention fingers for a PGA component of a given size replaces the integral base. Retention fingers in the frame capture the separate plate structure. The two-part chip carrier allows a single outer frame to accommodate plates for a range of PGA component sizes.

The Murphy patent, that is assigned to the same assignee as the present invention, discloses a chip carrier that comprises an outer frame with a centrally disposed laminated plate comprising conductive and non-conductive materials. Apertures through the laminated plate receive the PGA terminals and isolate them from the conductive layers of the plate. The outer frame extends around the periphery of the plate to the protect the component and its terminals from mechanical damage. A plurality of cantilevered arms adjacent a central opening through a retainer lock the PGA component against the laminated plates. Locking posts at opposite ends of the retainer engage latches formed on the outer frame and secure the retainer to the frame thereby to sandwich the PGA component therebetween.

These systems are somewhat difficult to utilize, particularly in fully automated production lines. In the Alemanni patents, a special tooling must spread the four retention fingers apart and simultaneously allow a vacuum head to position the PGA component in proper alignment with the terminal apertures through the plate. A similar procedure locates the PGA chip on the insert plate on the two-part carrier. When one positions the insert inside the frame and forces the insert toward the base of the frame, lever arms cam outwardly and allow the flanged tips of clips to return and capture the insert. In the Murphy patent, the locking posts align along an axis along which the chip carrier normally travels. This retention system is subject to being dislodged if the carrier receives a shock along that axis. In all these carriers, one must centrally locate the PGA component with respect to the supporting plate. Moreover, one must take care to avoid the introduction of undo stresses to the PGA component particularly during transport. Otherwise, the terminals can bend or hermetic seals can break open.

SUMMARY

Therefore it is an object of this invention to provide a production.

Another object of this invention is to provide a carrier system for PGA components that facilitates the alignment of a carrier and a PGA component during insertion.

Yet another object of this invention is to provide a carrier system for PGA components that facilitates the removal of the component from the chip carrier.

Still another object of this invention is to provide a carrier that absorbs mechanical shock to minimize the transfer of stress to the PGA component.

In accordance with this invention, a PGA carrier system comprises a chip carrier and one or both of a locator tool and a removal tool. The chip carrier includes a carrier frame means having a planar plate for supporting the pin grid array component in a plurality of apertures through which the PGA component terminals pass. The plate includes insulating means for isolating the individual terminals. A peripheral skirt transverse to the plate around the edge of the plate defines upper and lower nested cavities that protect the component housing and the terminal pins respectively. Shock absorbing means extend across one or both of two parallel ends of the peripheral skirt and absorb impact stresses that can occur during transport. Engagement means formed at the edges of the plate coact with a second engagement means formed in a removable retaining means. The retaining means overlies the component and holds the component in place. When the carrier system includes a removable alignment tool, the carrier frame contains locator means for that tool. The tool includes first portions for engaging the locator means and a body portion sized for a particular component configuration that constitutes a guide to properly position the component with respect to the surface of the plate.

A system removal tool constructed in accordance with the invention has a frame for positioning the chip carrier in the tool and transverse finger means that contact the engagement means on the carrier frame as the carrier frame is inserted in the tool. These finger means then deflect the engagement means to free the removable retaining means.

BRIEF DESCRIPTION OF THE DRAWINGS

This invention is pointed out with particularity in the appended claims. The various objects, advantages and novel features of this invention will be more fully apparent from a reading of the following detailed description in conjunction with the accompanying drawings in which like reference numerals refer to like parts, and in which:

DESCRIPTION OF ILLUSTRATIVE EMBODIMENTS

Figure 1:
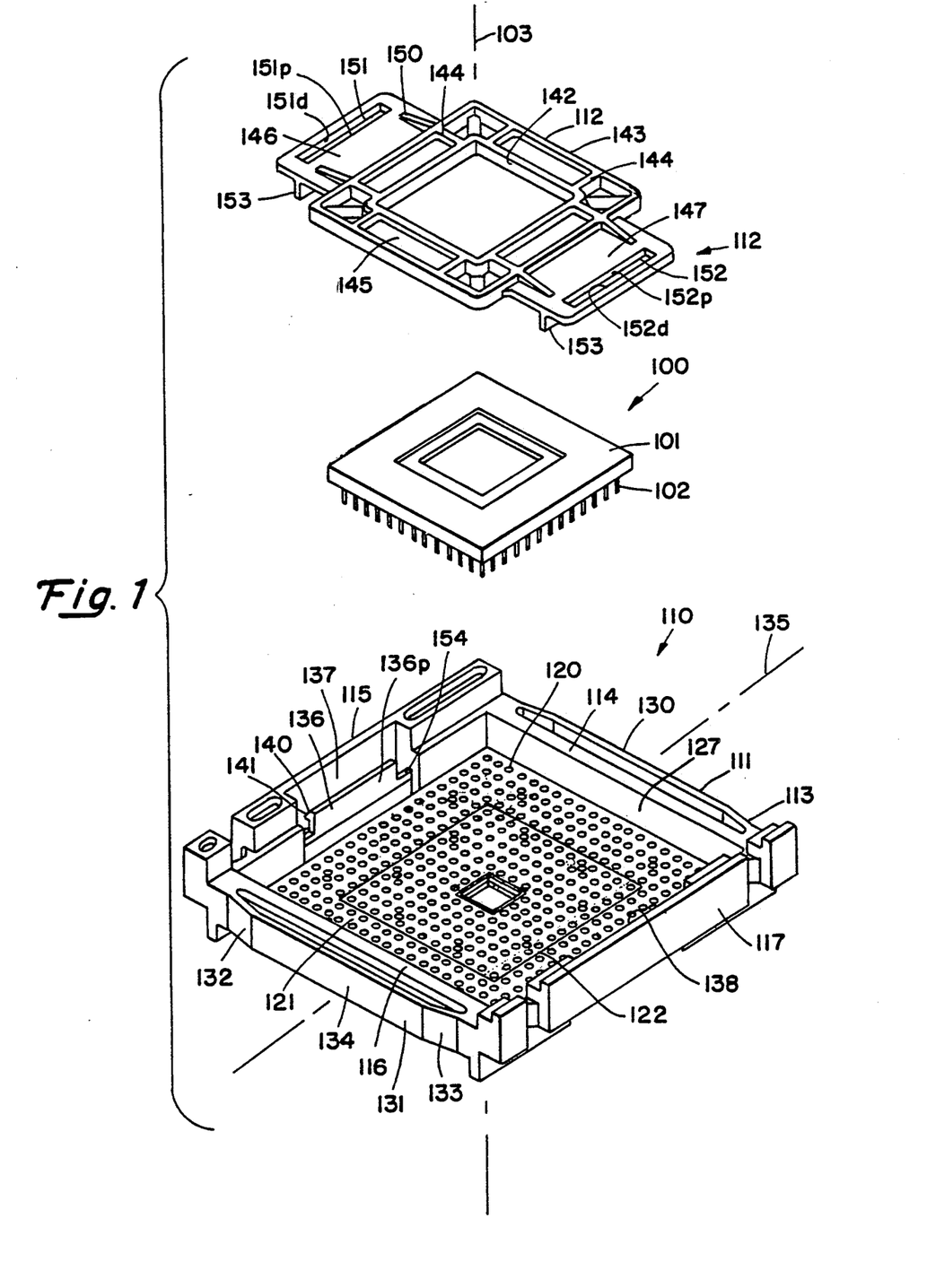
FIG. 1 is an exploded perspective view of a PGA integrated circuit, chip carrier frame and removable retaining device constructed in accordance with this invention.
Figure 2:
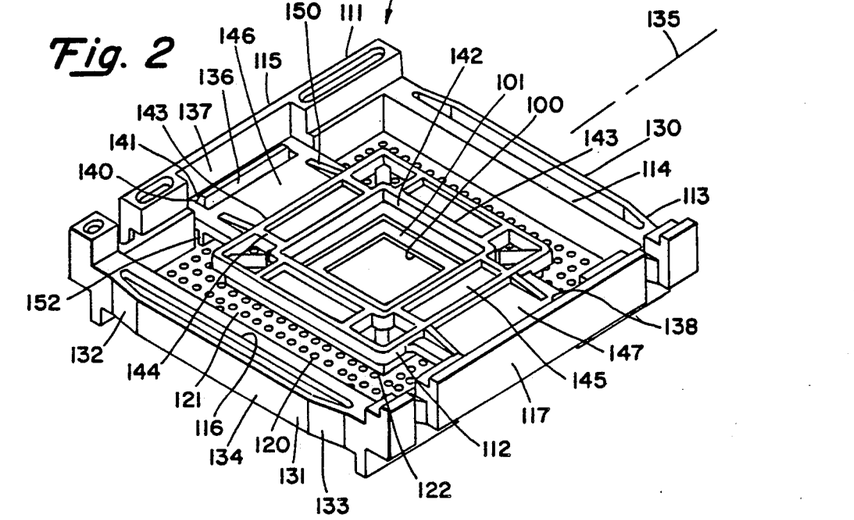
FIG. 2 is a perspective view of the components shown in FIG. 1 in an assembled view.

Referring to FIGS. 1 and 2 this invention is particularly useful in connection with the transportation, handling and testing of pin grid array (PGA) integrated circuits 100. As shown in FIGS. 1 and 2, such PGA integrated circuits typically comprise a ceramic planar square housing 101. A plurality of terminals 102 depend from the planar body portion 101. As shown in FIG. 1 the PGA integrated circuit 100 is centrally disposed of and normal to an axis 103. This invention is useful with a number of similarly formed components, such as other circuit elements that are formed in the so-called PGA packages and with circuits that could also have a rectangular, including square, shapes. The phrase "PGA component" in the description covers all such device characterized by a rectangular planar body portion and depending terminal portions in a predetermined array.

The PGA carrier system of this invention includes a chip carrier assembly 110 having a carrier frame 111 and a removable retaining means or cover 112. The carrier frame 111 comprises an outer or peripheral rectangular conductive frame 113 having four walls or skirts 114 through 117. A planar insulation plate 120 with an upper surface 121 and a plurality of apertures therethrough supports the housing 101. As more specifically shown in FIGS. 1 through 4, the plate 120 includes a plurality of apertures 122 therethrough having an inner surface 123. The insulating plate 120 additionally includes a bottom surface 124 and peripheral or edge surfaces 125. The bottom surface 124 of the insulating plate 120 lies on a conductive plate 126 that is formed integrally with the conductor frame 113.

Figure 4:
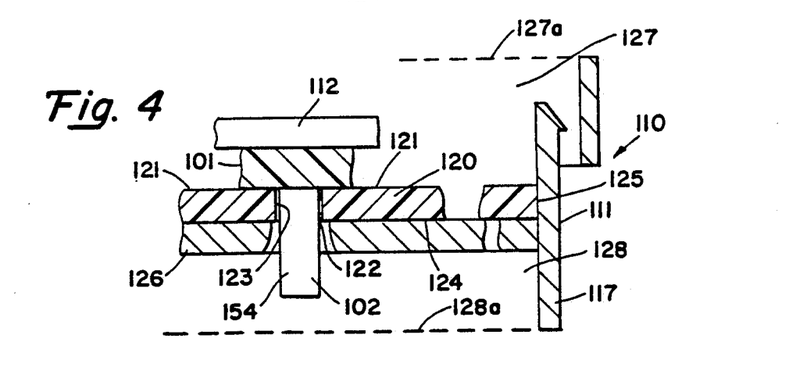
FIG. 4 is a detailed cross-section of a portion of a plate assembly shown in FIG. 3.

As shown more specifically in FIG. 4, the conductive plate portion 126 is integrally formed with the side walls or skirts such as the skirt 117 shown in FIG. 4 and is located about midway along the skirt and along the axis 103. This positioning of the plates 120 and 126 with the walls such as skirt 117 shown in FIG. 4 define an upper cavity 127 and a lower cavity 128 in which the integrated circuit is positioned. Dashed lines 127a and 128a denote the extent of the cavities 127 and 128, respectively. The cavity 127 protects the integrated circuit 100 from damage; the lower cavity 128 minimizes potential damage to the terminals 102.

Figure 3:
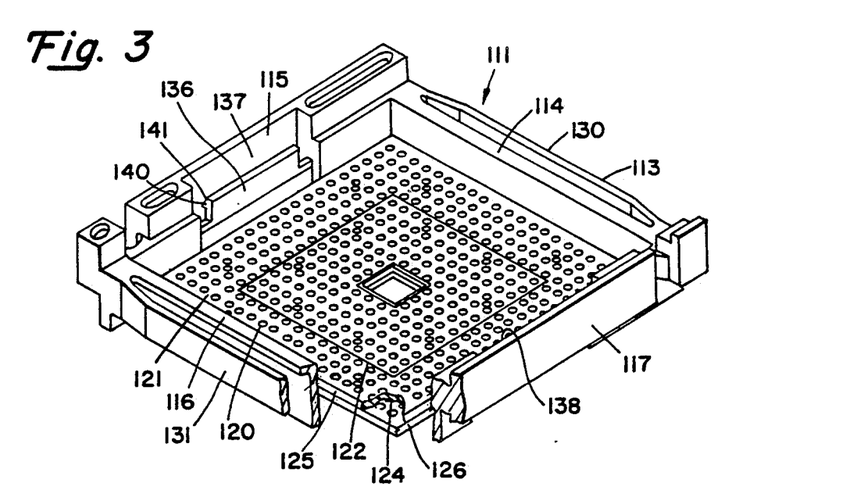
FIG. 3 is a perspective view of a portion of the chip carrier frame shown in FIGS. 1 and 2 in partial sections.

FIGS. 1 through 3 also depict an addition to the basic carrier frame that can improve mechanical protection for PGA components when it is anticipated that they will undergo shock. More specifically, as shown in FIGS. 1 through 3 bumpers 130 and 131 are spaced from and lie outside of walls 114 and 116. They have similar construction. By way of example, bumper 131 comprises offsetting end portions 132 and 133 and a central portion 134, as specifically shown in FIGS. 1 and 2. The offsetting end portions 132 and 133 are short with respect to the central portion 134 and space the portion 134 parallel to the wall 116. The offsetting end portion 132 comprises an end section 132A and an offsetting section 132B. Similarly the offsetting end portion 133 has an end section 133A and an offsetting section 133B. The end sections 132A and 133A lie in a common plane with adjacent corners of the carrier such that the outer surfaces are in the same plane. The offsetting sections 132B and 133B lie in planes that intersect the common plane and attach to the opposite ends of the central section 134. Thus, the central section 134 lies in a plane parallel to the common plane through the end sections 132A and 133A.

The bumpers 130 and 131 are integral with the conductive frame 110 and comprise thin webs of the conductive plastic material so the central section 134 is resilient and deflects under the application of a force along the motion axis 135. This deflection and deformation dissipates the forces and minimizes the resultant forces applied to the component 101.

More specifically, an axis 135 represents a typical motion axis That is, a chip carrier assembly 110 as shown in FIGS. 1 and 2 normally travels along a path corresponding to the axis 135. Shocks are likely to be imparted along the axis 135, particularly as one chip carrier assembly 110 strikes another during transport or handling. Any impact along an axis 135 flexes the bumpers 130 and 131. This dissipates energy imparted through the mechanical shock and minimizes any transfer of that shock to the PGA component 100 in the carrier frame 111. The bumpers 130 and 131 are, however, optional. That is, a chip carrier assembly also may have a single bumper, such as bumper 130, or no bumpers.

The removal component retaining means in the form of the cover 112 locks to the carrier frame 111 through the interaction of first engagement means on the carrier frame 111 and second engagement means on the cover 112 as shown in FIGS. 1 and 2. Referring first to the carrier frame 111, an upstanding arm 136 forms the first engagement means and lies centrally along the wall 115 in a gap 137 such that a central portion of the wall 115 lies to the exterior of the upstanding arm 136 and protects it from manipulation by external sources.

RM-20 A similar structure exists in a gap 138 with respect to wall 117, although it is not shown in the perspectives of FIGS. 1 and 2. The operation of the first and second engagement means are described in greater detail later. At this point it is sufficient to understand that the upstanding arm contains an upper or camming head portion 140 with an oblique surface 141 to the exterior side. With respect to the axis 135, the upstanding arm 136 has a proximal surface 136*p*.

Still referring to FIGS. 1 and 2, the cover 112 comprises an inner square frame 142 and an outer frame 143 interconnected by a series of transverse struts or ribs 144. The area between the frames 142 and 143 may also be filled by stabilizing closure panels. Latching extensions 146 and 147 cantilever from the outer frame 112; extensions 150 of the certain ribs 144 stabilize these extensions 146 and 147. Latching extensions contain rectangular slots 151 and 152, respectively that are sized to approximate the outline projection of the upstanding arms 136 in a plane parallel to the plate 120. Further, proximal surfaces 151*p* and 152*p* with respect to the axis 135 are spaced by a distance less than the distance between the proximal surface 136*p* and the corresponding surface on the other upstanding arm associated with the wall 117. The distance between distal surfaces 151*d* and 152*d* on the slots 151 and 152 is less than the distance between the oblique surface 141 on the upstanding arm 136 attached to the wall 115 and the corresponding surface associated with the arm in the gap 138 of the wall 117. The cover 112 also comprises two depending legs 153 extending from the latching extensions 146 and 147. These provide spacing for PGA components 100 that have greater than a predetermined thickness. For thin PGA components 100, the cover 112 is merely inverted and the rib section is positioned in contact with the PGA component. Typically the underside or bottom of the cover 112 as shown in FIG. 1 is a smooth planar surface.

During installation the PGA component 100 is positioned centrally on the plate 120 with the terminals 102 passing through the various apertures 122. As the cover 112 moves into position, it first engages the slots 137 formed in the wall 115 and corresponding slot at the wall 117. These slots 137 and 138 guide the cover to a position where it lies on the upstanding arm 136 at wall 115 and a corresponding arm at the wall 117. The relative spacings of the slots and arms prevent the cover 112 from additional movement. With downward pressure on the cover 112 the distal surfaces 151*d* and 152*d* engage the oblique surface 141 and the corresponding surface on the cam at the wall 117 thereby to deflect the arm 136 and the corresponding opposite arm toward the axis 135 until the cover 112 slides over the oblique surfaces, including oblique surface 141 the lower portion of the oblique surface 141 lies above the upper surface of the latching extensions 146 so the arm 136 relaxes. The lower portion of the oblique surface 141 then overlies a portion of the latching extensions 146 and locks the cover 112 into place. A similar action occurs at the wall 117. Thus the cover 112 and the carrier frame 111 capture the PGA component 100 in a positive manner. Moreover, as normal motion of the carrier assembly 110 is transverse to an axis through the latching extensions 146 and 147, any mechanical shocks imparted to the carrier along the axis 135 will not deflect the arm 136 or the corresponding arm at the wall 117 and Referring to FIG. 4, there is shown a partial cross-section including the wall 117, the conductive plate 126 extending from the wall 117, and the insulating plate 120 with a bottom surface 124 in contact with the upper surface of the conductive plate 126. The cover 112 captures the housing 101 against the insulating portion 120. The aperture 122 through the insulating material 120 has a diameter that is less than the corresponding diameter of the aperture 123 through the plate 126. As a result the aperture 122 centers the terminal 102 on the apertures 122 and 123 and isolates the terminals 102 from the conductive plate 126.

Figure 5:
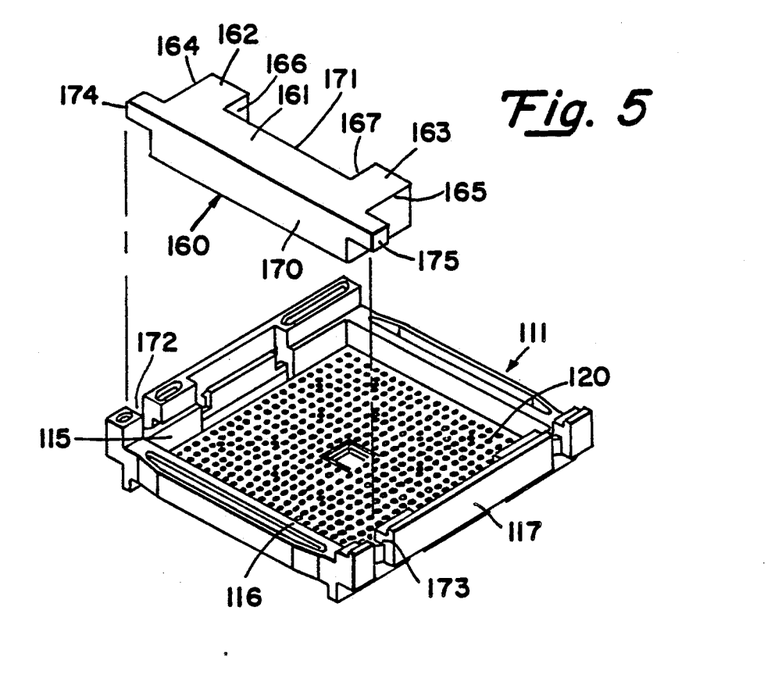
FIG. 5 is an exploded view of the chip carrier frame of FIG. 1 and a removable alignment tool constructed in accordance with another aspect of this invention.
Figure 6:
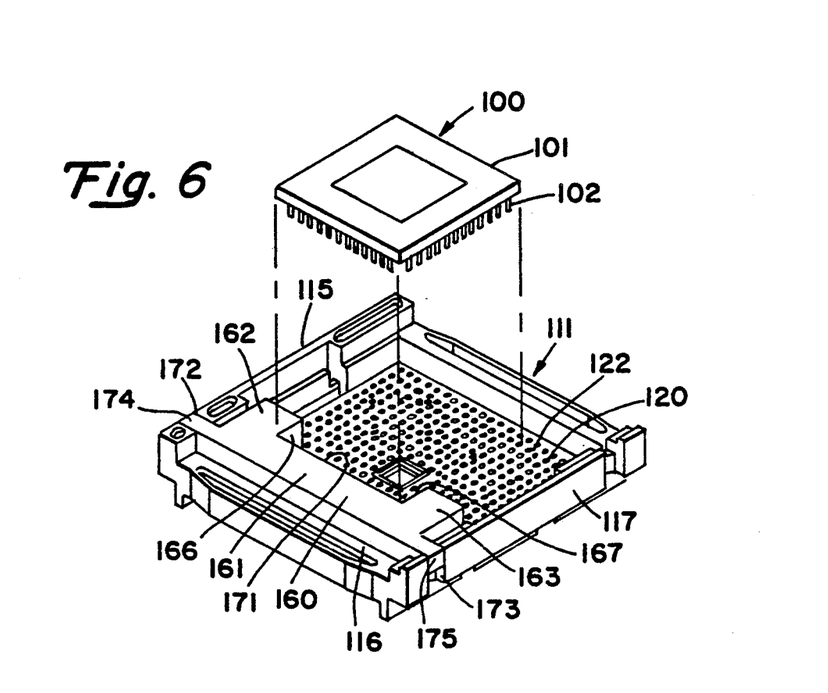
FIG. 6 is another exploded view of the chip carrier with the removable alignment tool of FIG. 5 in place and a PGA component.

In accordance with this invention, the carrier frame 111 and the cover 112 constitute a chip carrier assembly 110 and constitute two components of a system for facilitating and the handling of PGA and similar components. Another component of the system is a removable alignment tool and related structure in the carrier frame that interact to simplify the insertion of the PGA component centrally on the plate 102. Referring to FIGS. 5 and 6, a removable alignment tool 160 provides PGA component positioning. Typically one removable alignment tool 160 will be provided for each PGA component size. The removable alignment tool 160 as shown in FIGS. 5 and 6 comprises a central body portion with a thickness (the vertical dimension in FIGS. 5 and 6) approximating the overall height of a PGA component. Legs 162 and 163 extend transversely from the body portion 161 and have outer surfaces 164 and 165 respectively that abut the inner surfaces of the sides 115 and 117. Legs 162 and 163 additionally include inner surfaces 166 and 167 that have a spacing corresponding to the transverse dimension of the PGA component to be inserted into the carrier frame 111. A surface 170 on the removable alignment tool 160 abuts an inner surface of the wall 116 while another surface 171 parallels the surface 170 and lies between the surfaces 166 and 167. The dimension between the surfaces 170 and 171 is selected for a particular PGA component size to provide an appropriate offset for centering the PGA component or otherwise locating the PGA component in the carrier frame 111. As now will be apparent, the surfaces 166, 167 and 171 form a U-shaped interface for engaging three sides of a PGA component.

The structure for holding the removable alignment tool in position in the carrier frame 111 during the insertion of a PGA component includes recesses 172 and 173 formed in the opposite walls 115 and 117 adjacent corners common with the wall 116. The recesses 172 and 173 constitute locator means for arms 174 and 175 that extend from the central body portion 161. Typically the recesses 172 and 173 are available for engagement by tools used during production to facilitate the orientation of the carrier frame 111. Initially one lowers the alignment tool 160 until the locating arms 174 and 175 drop into the recesses 172 and 173. This properly positions the removable alignment tool with the surface 170 adjacent an interior portion of the wall 116. Next one positions a PGA component of a size corresponding to that of the selected removable alignment tool 160 and lowers it toward the insulating layer 120 Given the relative thicknesses of the alignment tool 160 and the PGA component 100, the edge surfaces of the housing 101 first engage the surfaces 166, 167 and 161 while the ends of the terminals 102 are still spaced from the insulating layer 120. With further displacement, the terminal pins, now being aligned with apertures 122 pass through their respective apertures and the PGA component 100 comes to rest on the insulating plate 120 with terminal pins 102 extending through the plate 120 and the underlying conductive plate 126 to the position shown in FIG. 4. At that point one simply removes the removable alignment tool 160 by lifting it out of the carrier frame and then installs the cover 112 onto the carrier frame 111 as previously described.

Figure 8:
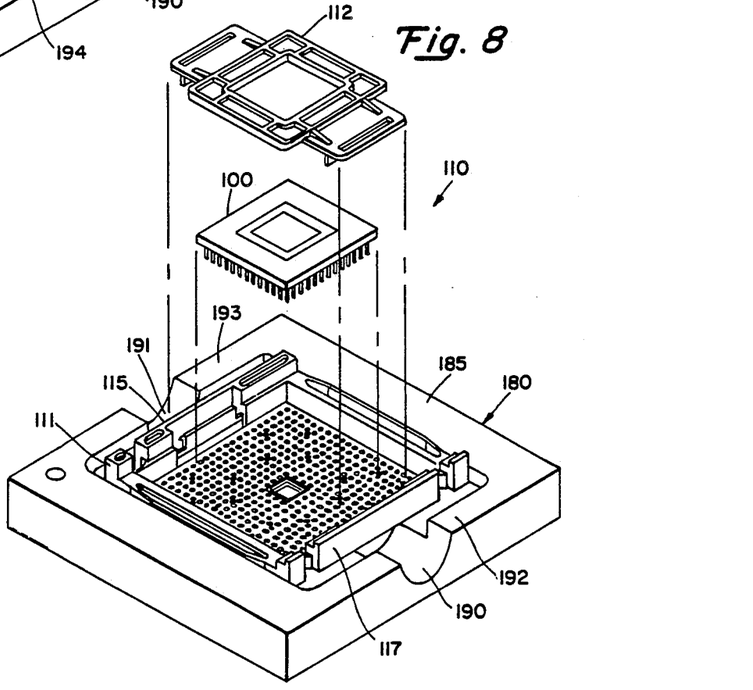
FIG. 8 depicts the removal tool of FIG. 7 after the retaining device and PGA component have been removed.
Figure 9:
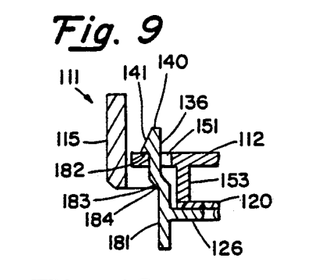
FIG. 9 is an enlarged cross section that illustrates the interconnection between a chip carrier frame and removable retaining device in the assembly shown in FIG. 1.

When it is necessary to remove the PGA component 100 from the carrier assembly 110, one inserts the carrier assembly 110 into a removal fixture 180, such as shown in FIGS. 8 and 9, that releases the cover 112 from the carrier frame 111. FIG. 9 depicts a portion of the carrier assembly 110 in a detailed cross-section. In FIG. 9, the cover 112 lies inside the wall 115. The depending leg 153 abuts the insulating plate 120. The upstanding arm 136 includes a base portion 181 that extends transversely to and is formed integrally with the conductive plate 126. The camming head portion 140 includes the oblique surface 141 that extends to a base 182 that overlies an upper portion of the cover 112 and locks the cover 112 in the carrier frame 111. An intermediate portion 183 includes a camming surface 184.

Figure 7:
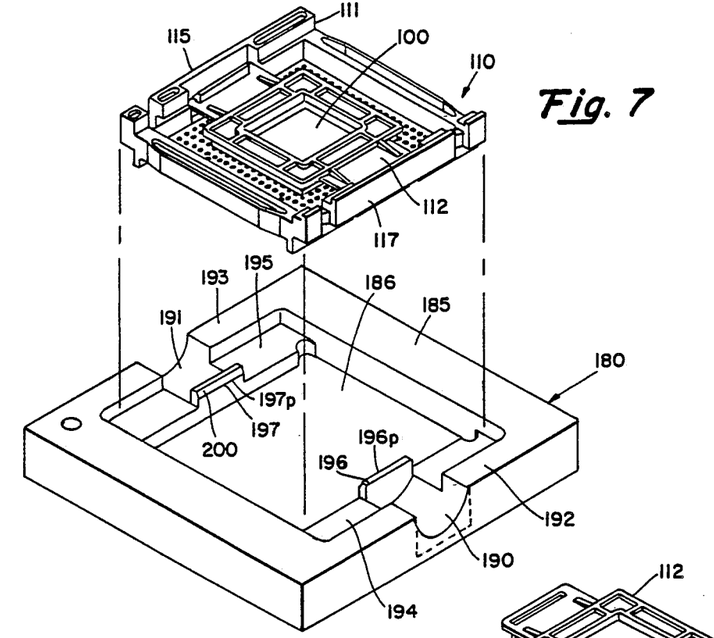
FIG. 7 is an exploded view that illustrates the alignment of a chip carrier assembly as shown in FIG. 2 and a removal tool constructed in accordance with another aspect of this invention for facilitating the removal of a retaining device.

As shown particularly in FIG. 7 the removable fixture 180 includes an outer rectangular frame 185 with a recessed central cavity 186. The removable fixture 180 additionally includes collinear recesses 190 and 191 that pass through walls 192 and 193 centrally of those walls. These recesses may be circular or rectangular and provide finger or other gripping access to opposite walls 115 and 117 of the carrier frame 110 thereby to facilitate the removal of the carrier frame from the fixture. The cavity 186 also includes a stepped bottom with steps 194 and 195 extending inwardly from the walls 192 and 193. These steps seat the bottom surfaces of the walls 115 and 117 when the carrier frame 111 is properly seated. Upstanding fingers 196 and 197 extend upwardly from the steps 194 and 195 respectively. These upstanding fingers have a chamfered upper surface 200 as shown in FIGS. 7 and 8 and more clearly shown in FIG. 10. The distance between proximal surfaces 197p and 196p of the upstanding fingers 196 and 197 are selected to be substantially equal to the distance between the distal surfaces 151d and 152d of the cover 112 shown in FIGS. 1 and 10.

Figure 10:
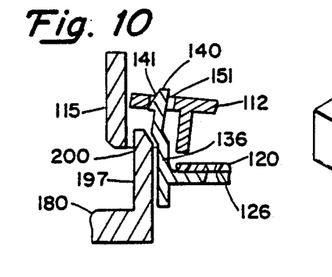
FIG. 10 is another enlarged section that illustrates the orientation of portions of the chip carrier frame and removable retaining means when a chip carrier assembly is located in the removal tool.

As a carrier assembly 110 moves downwardly into the removal fixture 180 from the position shown in FIG. 7 to that shown in FIG. 8, the upstanding fingers 196 and 197 slide upwardly and engage the upstanding arms on the carrier frame 111 such as the upstanding arm 136 shown more specifically in FIGS. 9 and 10. Initially the chamfered surface 200 of the upstanding finger 197 engages the camming surface 184 of the upstanding arm 136. As both the upstanding fingers 196 and 197 engage their corresponding upstanding arms in the carrier frame 111 such as the arm 136 and as the inner surfaces of the cavity 186 position the carrier frame 111, further downward pressure on the carrier frame 111 will cause the upstanding fingers 196 and 197 to deflect the arms 136 and a corresponding arm at the wall 117 toward the center of the carrier frame. As shown in FIG. 10, this aligns the camming head portion 140 and the slot 151 so that the cover 112 can pass by the portion 140. The upstanding fingers 196 and 197 have a height that enables the upstanding finger 120 to displace the cover 112 past the camming head portion 140 by engaging the outer edge of the extension 151. Thus, when the carrier frame 111 fully seats in the removal tool 180, the cover 112 is completely released from the carrier frame 111. It is a simple matter to remove the cover 112 and the PGA component 110 as shown in FIG. 8. When this is complete, the carrier frame 111 is then easily removed by grasping it through the recesses 190 and 191 for use with another PGA component.

In summary, there is described a system for facilitating the handling and testing of PGA and similar components during electronic assembly and production. The system comprises a carrier frame and removable retention structures that capture and protect a PGA component during production. The carrier frame electrically isolates each terminal and makes the terminals readily accessible to facilitate component testing prior to assembling a particular component onto a circuit board. Moreover, the carrier may include shock absorbing bumpers that dissipate mechanical shocks thereby to protect the component.

The system also includes a removable alignment tool that simplifies the positioning of a variety of sizes of PGA or similar components onto a supporting surface of the carrier whereby an individual carrier is easily adapted for carrying PGA components in a variety of sizes without the need for special inserts. A removal tool coacts with elements of the carrier frame and cover that maintain a clamping relationship between the two to facilitate the disconnection and removal of the cover from the carrier thereby facilitating the removal of the PGA component.

This invention has been disclosed in terms of certain embodiments. It will be apparent that many modifications can be made to the disclosed apparatus without departing from the invention. Therefore, it is the intent of the appended claims to cover all such variations and modifications as come within the true spirit and scope of this invention.

What is claimed as new and desired to be secured by Letters Patent of the United States is:

1. A carrier system for facilitating the production of electrical assemblies including a pin grid array component having a planar body portion and a plurality of terminals depending therefrom essentially perpendicularly to the plane of the component, said carrier system comprising:

A. carrier frame means including a planar plate means having a surface for supporting the pin grid array body portion during production and a plurality of apertures for allowing the terminals to pass through said planar plate means, skirt means transverse to said planar plate means at portions of the periphery thereof for defining nested cavities with said planar plate means, locator means at predetermined positions in said carrier frame means for engagement during production to facilitate the orientation of said carrier frame means and the component, and first engagement means transverse to said planar plate means,
   B. removable alignment means for guiding a component to an appropriate position on said plate means including first portions for engaging said locator means and second portions for abutting the planar body portion of the component thereby to locate the component with respect to said planar plate means and the apertures therethrough for facilitating the insertion of the component in said carrier frame means, and
   C. removable retaining means for retaining the component against said planar plate means during production including an overlying portion for engaging the component body portion and second engagement means coacting with said first engagement means for locking said retaining means to said carrier frame means.

2. A carrier system as recited in claim 1 wherein said planar plate means has a rectangular configuration and said locator means comprises aligned slots in said skirt means at adjacent corners formed at the periphery of said plate means.

3. A carrier system as recited in claim 2 wherein said removable alignment means comprises a central body portion and said first portions comprise co-linear extensions from opposite sides of said central body portion for engaging said aligned slots of said locator means, said central body portion having dimension transverse to said co-linear extensions that is determined by the component to be inserted in said carrier frame means.

4. An carrier system as recited in claim 3 wherein said locator means body portion includes a first body portion of the predetermined dimension and first and second leg portions extending transversely from said first body portion and said leg portions being spaced by a distance corresponding to the transverse dimension of the component and said locator means having a dimension normal to said planar plate means that exceeds the corresponding overall dimension of the component body portion and depending terminals whereby said locator means engages and guides the component prior to the passage of terminals through the apertures in said plate means.

5. A carrier system as recited in claim 2 wherein said carrier frame means is adapted for motion along an axis between said locator slot means, said carrier frame means additionally comprising shock absorbing means connected to said skirt means along one peripheral edge thereof.

6. A carrier system for facilitating the production of electrical assemblies including a pin grid array component having a planar body portion and a plurality of terminals depending therefrom essentially perpendicularly to the plane of the component, said carrier system comprising:

A. carrier frame means including a planar plate means having a surface for supporting the pin grid array body portion during production and a plurality of apertures for allowing the terminals to pass through said planar plate means, skirt means transverse to said planar plate means at portions of the periphery thereof for defining nested cavities with said planar plate means and first engagement means being characterized by relaxed and stressed positions, being transverse to said planar plate means and having first and second camming surfaces thereon,
   B. removable retaining means for retaining the component against said planar plate means including an overlying portion for engaging the component body portion and second engagement means coacting with said first engagement means for locking said retaining means to said carrier frame means, and
   C. removal means for assisting in removing said retaining means from said carrier frame means, said removal means having a first means for engaging said carrier frame means skirt means thereby to align said carrier frame means in a position parallel to and spaced from said removal means and cam actuator means extending transversely to said removal means and in positions corresponding to said first engagement means for engaging said second camming surfaces thereby to return said first engagement means to a stressed position at which said retaining means can be removed.

7. A carrier system as recited in claim 6 wherein said carrier frame means is adapted to move along a first axis and wherein:

A. said planar plate means has a rectangular configuration with four edge sections and said skirt means engage said plate means at said four edge sections, said first engagement means comprising an upstanding arm connected at the base thereof to each of the edge sections parallel to the first axis, each said arm comprising a base portion connected to said planar plate means at an edge thereof, a camming head portion displaced from said base portion and an intermediate portion interconnecting said base and camming head portions, said camming head portion of each said arm being adapted for movement transverse to the first axis about said base portion thereof, and
   B said second engagement means of said removable retaining means including extensions from said overlying portion including means for defining slots therein for engaging said camming head portions on each said arm thereby to deflect said arms to a stressed position whereby said arms pass through said slots in said removable retaining means, said arms returning to their relaxed positions when said camming head portions of said arms pass through said slots in said removable retaining means.

8. A carrier system as recited in claim 7 wherein said first means in said removal means comprises an open rectangular base means with a closed bottom portion for nesting said carrier frame means and wherein said cam actuator means includes rigid upstanding fingers extending from said base means for engaging said second camming surfaces on said first engagement means thereby to deflect said arms to their respective stressed positions simultaneously to facilitate the removal of said removable retaining means from said carrier frame means.

9. A carrier system as recited in claim 8 wherein said arms in said first engagement means and said slots in said second engagement means of said removable retaining means are parallel to the first axis, the distance between the surfaces of said slots proximate the first axis being less than the distance between the proximal surfaces of said arms and the distance between the distal surfaces of said slots being greater than the distance between the distal surfaces of said arms.

10. A carrier system as recited in claim 9 wherein said fingers in said removal means have counterfacing surfaces that are chamfered at the extremities thereof and wherein said fingers are parallel to a removal means axis corresponding to the first axis when said carrier frame means in inserted in said removal means, the distance between the proximal surfaces of said fingers being less than the distance between the distal surfaces of said arms whereby said fingers force said arms toward said removal means axis when said carrier frame means nests in said removal means.

11. A carrier system as recited in claim 10 wherein each of said camming head portions of said first engagement means has a triangular cross section with a base adjacent said intermediate portion extending beyond the distal surface thereof, said second engagement means of said removable retaining means engaging an oblique surfaces of said camming head portions to deflect said arms of said first engagement means into alignment with the slots in said second engagement means, said base portions overlying said removable retaining means adjacent the distal surfaces of said slots when said arms return to their relaxed positions.

12. A carrier system as recited in claim 8 wherein said removable retaining means has depending leg means extending from one surface thereof for spacing said removable retaining means from said planar plate means by engaging said planar plate means.

13. A carrier system for facilitating the production of electrical assemblies including a pin grid array component having a planar body portion and a plurality of terminals depending therefrom essentially perpendicularly to the plane of the component, said carrier system comprising:

A. carrier frame means including rectangular planar plate means having a surface for supporting the pin grid array body portion during production and a plurality of apertures for allowing the terminals to pass through said planar plate means, transverse skirt means joined to said planar plate means at the edges thereof for defining nested cavities with said planar plate means, locator means including aligned slots in said skirt means at adjacent corners of said plate means for engagement during production to facilitate the orientation of said carrier frame means and the component, and first engagement means transverse to said planar plate means, B. removable alignment means comprising a central body portion and co-linear extensions from opposite sides of said central body portion for engaging said aligned slots of said locator means, said central body portion having dimension transverse to said co-linear extensions that is determined by the component to be inserted in said carrier frame means thereby to locate the component with respect to said planar plate means and the apertures therethrough, C. removable retaining means for retaining the component against said planar plate means including an overlying portion for engaging the component body portion and second engagement means coacting with said first engagement means for locking said retaining means to said carrier frame means.

D. removal means for assisting in removing said retaining means from said carrier frame means, said removal means having a first means for engaging said carrier frame means skirt means thereby to align said carrier frame means in said removal means and cam actuator means extending transversely to said removal means and in positions corresponding to said first engagement means for engaging said second camming surfaces thereby to return said first engagement means to a stressed position from which said retaining means can be removed.

14. A carrier system as recited in claim 13 wherein said locator means body portion includes a first body portion of the predetermined dimension and first and second leg portions extending transversely from said first body portion, said leg portions being spaced by a distance corresponding to the transverse dimension of the component and said locator means having a dimension normal to said planar plate means that exceeds the corresponding overall dimension of the component body portion and depending terminals whereby said locator means can engage and guide the component prior to the terminals passage through the apertures in said plate means.

15. A carrier system as recited in claim 14 wherein said removable retaining means has depending leg means extending from one surface thereof for spacing said removable retaining means from said planar plate means by engaging said planar plate means.

16. A carrier system as recited in claim 14 wherein said carrier frame means is adapted to move along a first axis and wherein:

A. said planar plate means has a rectangular configuration with four edge sections and said skirt means engage said plate means at said four edge sections, said first engagement means comprising an upstanding arm connected at the base thereof to each of the edge sections parallel to the first axis, each said arm comprising a base portion connected to said planar plate means at an edge thereof, a camming head portion displaced from said base portion and an intermediate portion interconnecting said base and camming head portions, said camming head portion of each said arm being adapted for movement transverse to the first axis about said base portion thereof, B. said second engagement means of said removable retaining means including extensions from said overlying portion including means for defining slots therein for engaging said camming head surfaces on each arm thereby to deflect said arms to a stressed position whereby said arms pass through said slots in said removable retaining means, said arms returning to their relaxed positions when said camming head portions of said arms pass through said slots in said removable retaining means, and C. said first means in said removal means comprises an open rectangular base means with a closed bottom portion for nesting said carrier frame means and wherein said cam actuator means include rigid upstanding fingers extending from said base means for engaging said second camming surfaces on said first engagement means thereby to deflect said arms to their respective stressed positions simultaneously to facilitate the removal of said removable retaining means from said carrier frame means.

17. A carrier system as recited in claim 16 wherein said arms in said first engagement means and said slots in said second engagement means of said removable retaining means are parallel to the first axis, the distance between the surfaces of said slots proximate the first axis being less than the distance between the proximal surfaces of said arms and the distance between the distal surfaces of said slots being greater than the distance between the distal surfaces of said arms.

18. A carrier system as recited in claim 17 wherein:
A. said fingers in said removal means have counterfacing surfaces that are chamfered at the extremities thereof and wherein said fingers are parallel to a removal means axis corresponding to the first axis when said carrier frame means in inserted in said removal means, the distance between the proximal surfaces of said fingers being less than the distance between the distal surfaces of said arms whereby said fingers force said arms toward said removal means axis when said carrier frame means nests in said removal means, and
B. each of said camming head portions of said first engagement means has a triangular cross section with a base adjacent said intermediate portion extending beyond the distal surface thereof, said second engagement means of said removable retaining means engaging an oblique surfaces of said camming head portions to deflect said arms of said first engagement means into alignment with the slots in said second engagement means, said base portions overlying said removable retaining means adjacent the distal surfaces of said slots when said arms return to their relaxed positions.

* * * * *